(12) United States Patent
Sun et al.

(10) Patent No.: US 11,964,851 B2
(45) Date of Patent: Apr. 23, 2024

(54) OVERHEAD HOIST TRANSFER APPARATUS

(71) Applicant: MIRLE AUTOMATION CORPORATION, Hsinchu (TW)

(72) Inventors: Houng Sun, Hsinchu (TW); Cheng-Cheng Lo, Hsinchu (TW); Chuan-Ming Chung, Hsinchu (TW)

(73) Assignee: MIRLE AUTOMATION CORPORATION, Hsinchu (TW)

(*) Notice: Subject to any disclaimer, the term of this patent is extended or adjusted under 35 U.S.C. 154(b) by 839 days.

(21) Appl. No.: 17/091,058

(22) Filed: Nov. 6, 2020

(65) Prior Publication Data
US 2021/0316967 A1    Oct. 14, 2021

Related U.S. Application Data

(60) Provisional application No. 63/006,903, filed on Apr. 8, 2020.

(30) Foreign Application Priority Data

Jul. 21, 2020 (TW) ................................ 109124616

(51) Int. Cl.
*B66C 19/00* (2006.01)
*B65G 43/08* (2006.01)
(Continued)

(52) U.S. Cl.
CPC .............. *B66C 19/00* (2013.01); *B65G 43/08* (2013.01); *B66C 7/08* (2013.01); *B66C 7/12* (2013.01);
(Continued)

(58) Field of Classification Search
None
See application file for complete search history.

(56) References Cited

U.S. PATENT DOCUMENTS 9,061,839 B2 * 6/2015 Murayama ........ H01L 21/67715
9,630,632 B2 * 4/2017 Wada ...................... B61C 13/04
(Continued)

FOREIGN PATENT DOCUMENTS

CN    103612882 A    3/2014
CN    104326230 A    2/2015
(Continued)

OTHER PUBLICATIONS

Japan Patent Office, Office Action dated Jan. 4, 2022 for JP application No. 2020-190848.

*Primary Examiner* — Scott A Browne
(74) *Attorney, Agent, or Firm* — Li & Cai Intellectual Property (USA) Office

(57) ABSTRACT

An overhead hoist transfer (OHT) apparatus and a differential overhead trolley thereof are provided. The OHT apparatus includes a rail module and a differential overhead trolley. The rail module includes a main rail and a first rail, and defines a turning path extending from the main rail to the first rail. The differential overhead trolley is movably disposed on the rail module, and includes a walking mechanism and a carrying body that is hung on the rail module by being connected to the walking mechanism. The walking mechanism includes two differential wheels and a driving unit that is connected to the two differential wheels. When the differential overhead trolley is moved along the turning path, the driving unit is configured to drive the two differential wheels to move along the first rail by different rolling velocities.

14 Claims, 11 Drawing Sheets

(51) Int. Cl.
  *B66C 7/08* (2006.01)
  *B66C 7/12* (2006.01)
  *B66C 9/04* (2006.01)
  *B66C 11/00* (2006.01)
  *G08C 17/02* (2006.01)
  *H01L 21/67* (2006.01)
  *H01L 21/677* (2006.01)

(52) U.S. Cl.
  CPC ............. *B66C 9/04* (2013.01); *B66C 11/00* (2013.01); *G08C 17/02* (2013.01); *H01L 21/67259* (2013.01); *H01L 21/67706* (2013.01); *H01L 21/67724* (2013.01); *H01L 21/67733* (2013.01); *B65G 2203/0283* (2013.01); *B66C 2700/018* (2013.01)

(56) References Cited

U.S. PATENT DOCUMENTS

| | | |
|---|---|---|
| 10,065,663 B2 | 9/2018 | Katahira et al. |
| 2013/0061772 A1* | 3/2013 | Chen ................ H01L 21/67733 104/91 |

FOREIGN PATENT DOCUMENTS

| | | | |
|---|---|---|---|
| CN | 109131381 A | | 1/2019 |
| CN | 210062968 U | | 2/2020 |
| CN | 210639464 U | * | 5/2020 |
| GB | 1345623 A | | 1/1974 |
| JP | 59106358 A | | 6/1984 |
| JP | 59202972 A | | 11/1984 |
| JP | 8113144 A | | 5/1996 |
| JP | 2005186843 A | | 7/2005 |
| JP | 2015199394 A | | 11/2015 |
| WO | WO 2015075995 A1 | | 5/2015 |
| WO | WO 2017106986 A1 | | 6/2017 |

* cited by examiner

OVERHEAD HOIST TRANSFER APPARATUS

CROSS-REFERENCE TO RELATED PATENT APPLICATION

This application claims the benefit of priority to Taiwan Patent Application No. 109124616, filed on Jul. 21, 2020. The entire content of the above identified application is incorporated herein by reference.

This application claims priority to the U.S. Provisional Patent Application Ser. No. 63/006,903 filed on Apr. 8, 2020, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transfer apparatus, and more particularly to an overhead hoist transfer (OHT) apparatus and a differential overhead trolley thereof.

BACKGROUND OF THE DISCLOSURE

A conventional overhead hoist transfer (OHT) apparatus includes a rail module and a trolley that is movable along the rail module, and the trolley is provided without any differential design, so that a turn portion of the rail module needs to be designed for being used in cooperation with the trolley. Specifically, when the trolley is moved to a bifurcation path of the rail module, wheels on one side of the trolley would continue to move on (the turn portion of) the rail module, but wheels on another side of the trolley are suspended (or are not in contact with the turn portion of the rail module). However, the wheels on two opposite sides of the conventional trolley are configured to be rolled by the same rolling velocity, so that the wheels on two opposite sides of the conventional trolley are not suitable to move on a curved rail without any bifurcation path.

SUMMARY OF THE DISCLOSURE

In response to the above-referenced technical inadequacies, the present disclosure provides an overhead hoist transfer (OHT) apparatus and a differential overhead trolley thereof to effectively improve on the issues associated with conventional trolleys.

In one aspect, the present disclosure provides an overhead hoist transfer apparatus, which includes a rail module and a differential overhead trolley being movably disposed on the rail module. The rail module includes a main rail and a first rail, and the rail module defines a turning path that extends from the main rail to the first rail. The differential overhead trolley includes a walking mechanism and a carrying body that is connected to the walking mechanism and that is hung on the rail module. The walking mechanism includes two differential wheels arranged on two opposite sides thereof and a driving unit that is connected to the two differential wheels. When the differential overhead trolley is moved from the main rail to the first rail along the turning path, the driving unit drives the two differential wheels to forwardly roll on the first rail by different rolling velocities.

In another aspect, the present disclosure provides a differential overhead trolley of an overhead hoist transfer apparatus, which includes a walking mechanism and a carrying body. The walking mechanism includes two differential wheels and a driving unit that is connected to the two differential wheels. The driving unit is configured to drive the two differential wheels to forwardly roll on a rail module by different rolling velocities. The carrying body is connected to the walking mechanism and is configured to be hung on the rail module.

Therefore, the OHT apparatus of the present disclosure is provided by assembling the two differential wheels and the driving unit to the differential overhead trolley, so that when the differential overhead trolley travels in a turning area, the driving unit can drive the two differential wheels to run by different rolling velocities, thereby facilitating the differential overhead trolley to forwardly move on different turning rails.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
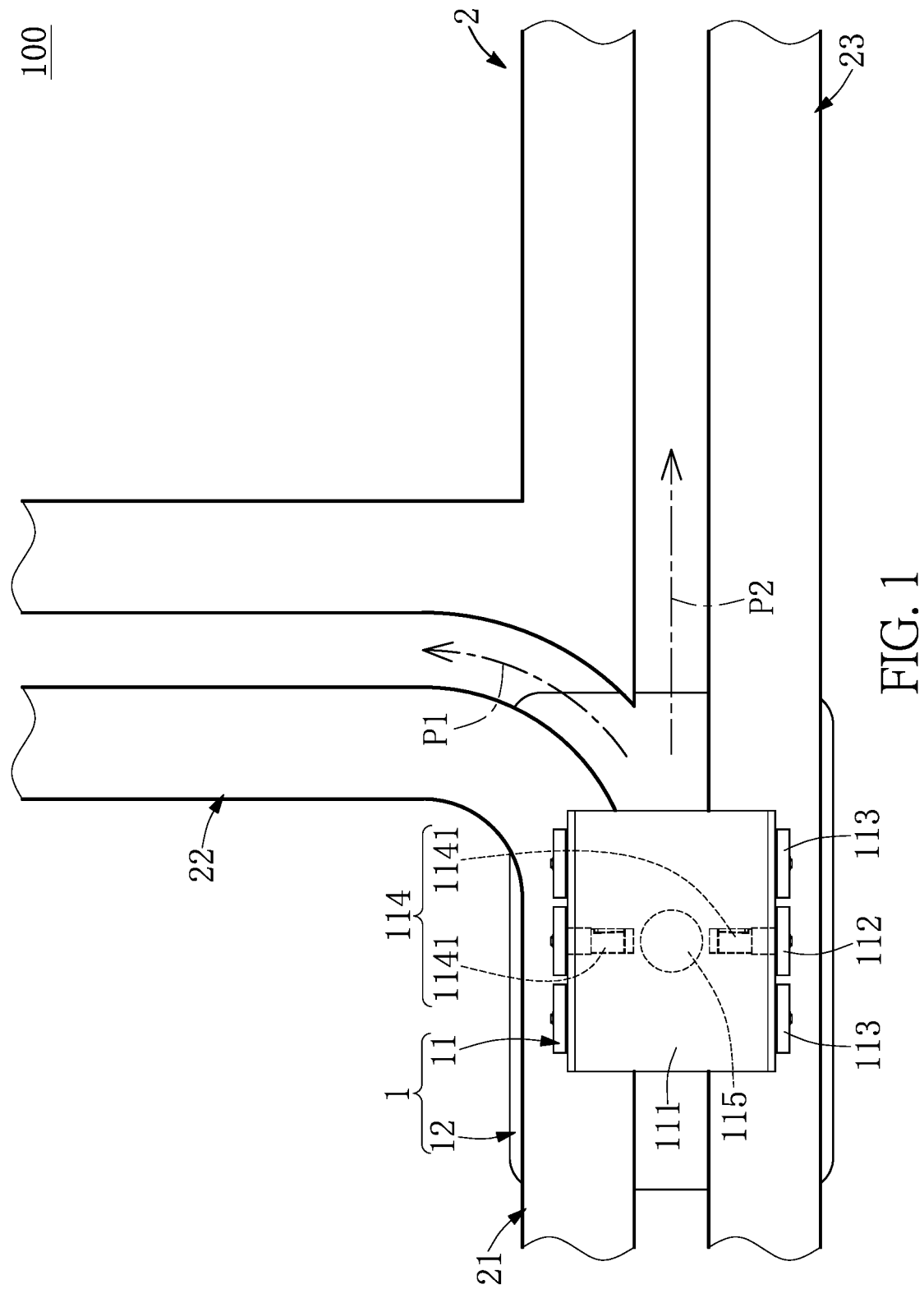
FIG. 1 is a top view of an overhead hoist transfer (OHT) apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides an overhead hoist transfer (OHT) apparatus 100. The OHT apparatus 100 includes a rail module 2 for being assembled to a factory ceiling and a differential overhead trolley 1 that is movably disposed on the rail module 2. In order to clearly describe the OHT apparatus 100, the following description describes the structure and connection relationship of each of the differential overhead trolley 1 and the rail module 2.

It should be noted that the differential overhead trolley 1 in the present embodiment is described in cooperation with the rail module 2, but the present disclosure is not limited thereto. For example, in other embodiments of the present disclosure, the differential overhead trolley 1 can be independently used (e.g., sold) or can be used in cooperation with other components (e.g., other rails different from the rail module 2 of the present embodiment).

Figure 2:
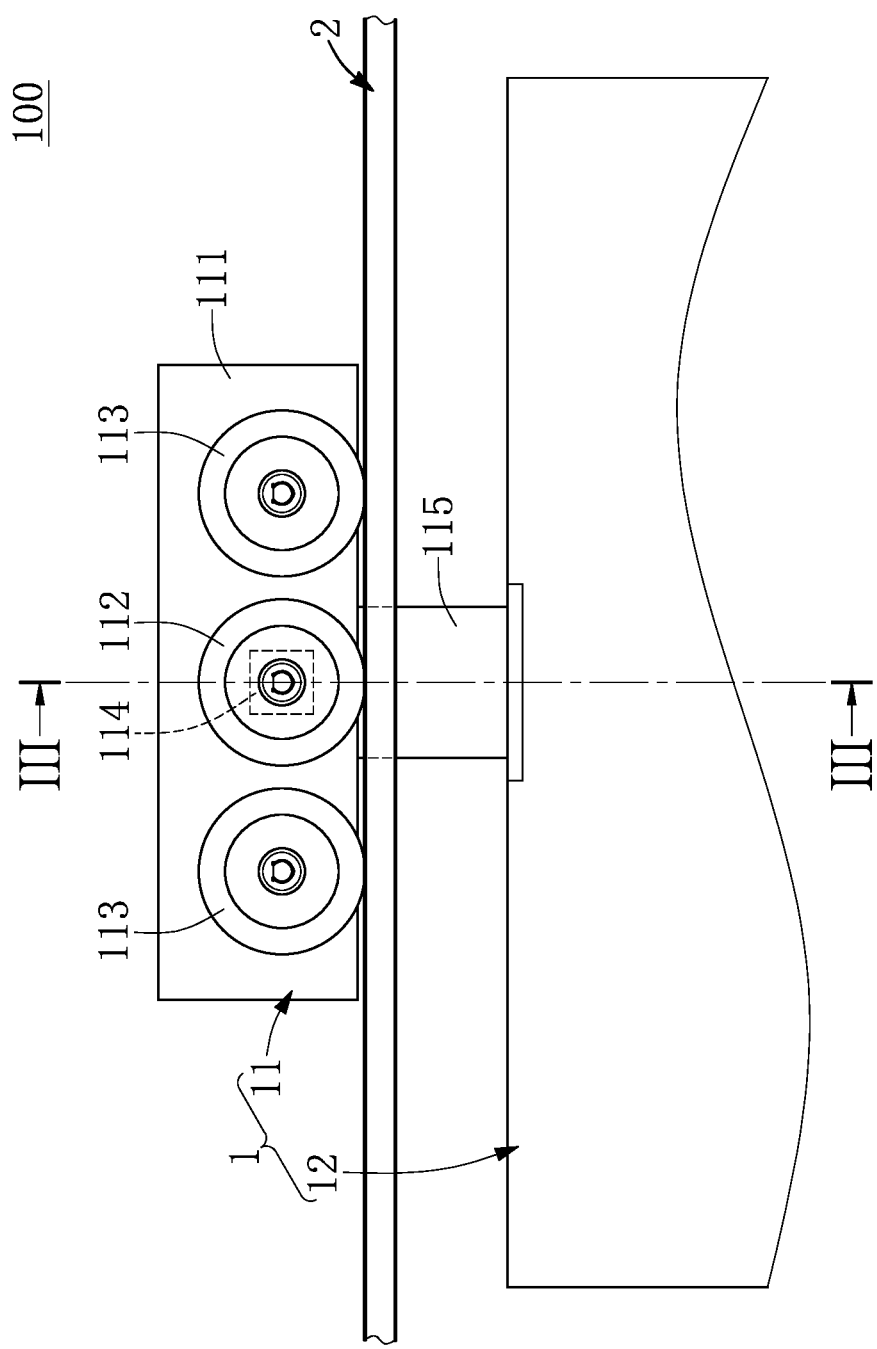
FIG. 2 is a lateral side view of a portion of FIG. 1.
Figure 3:
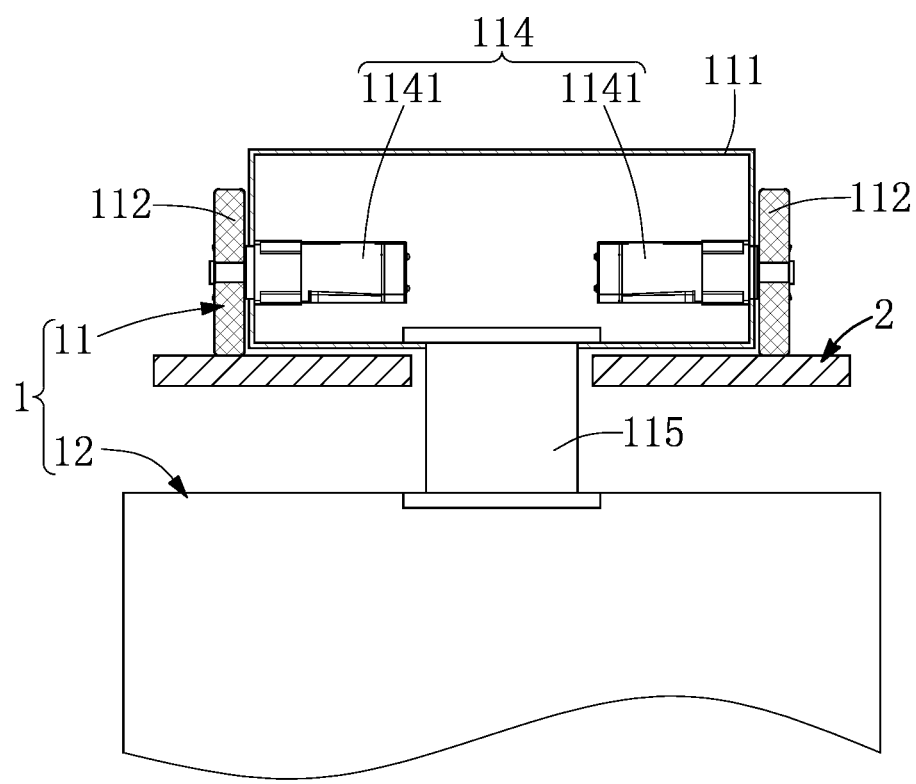
FIG. 3 is a cross-sectional view taken along line III-III of FIG. 2.

As shown in FIG. 1 to FIG. 3, the differential overhead trolley 1 includes a walking mechanism 11 and a carrying body 12 that is connected to the walking mechanism 11 and that is configured to be hung on the rail module 2. The walking mechanism 11 is a structure capable of moving with the carrying body 12 along the rail module 2, and the carrying body 12 is a structure for accommodating a front opening unified pod (FOUP) (not shown in the drawings), but the walking mechanism 11 and the carrying body 12 of the present disclosure are not limited thereto.

In the present embodiment, the walking mechanism 11 includes a main body 111, two differential wheels 112 respectively assembled to two opposite sides of the main body 111, a plurality of driven wheels 113 respectively assembled to the two opposite sides of the main body 111, a driving unit 114 received (or assembled) in the main body 111, and a connecting member 115 that connects the main body 111 and the carrying body 12, but the present disclosure is not limited thereto. For example, in other embodiments of the present disclosure, the quantity of the differential wheels 112 of the walking mechanism 11 can be more than two so as to omit the driven wheels 113; or, the two differential wheels 112 and the driving unit 114 can be used in cooperation with other components.

The two differential wheels 112 are connected to the driving unit 114, and the driving unit 114 is configured to drive the two differential wheels 112 to forwardly roll on the rail module 2 by different rolling velocities. The driven wheels 113 are unconnected to the driving unit 114 and are configured to be rollably disposed on the rail module 2, and any one of the two differential wheels 112 is located between two of the driven wheels 113 adjacent to each other. One end of the connecting member 115 is connected to the main body 111, and another end of the connecting member 115 is connected to the carrying body 12 by passing through the rail module 2.

Figure 4:
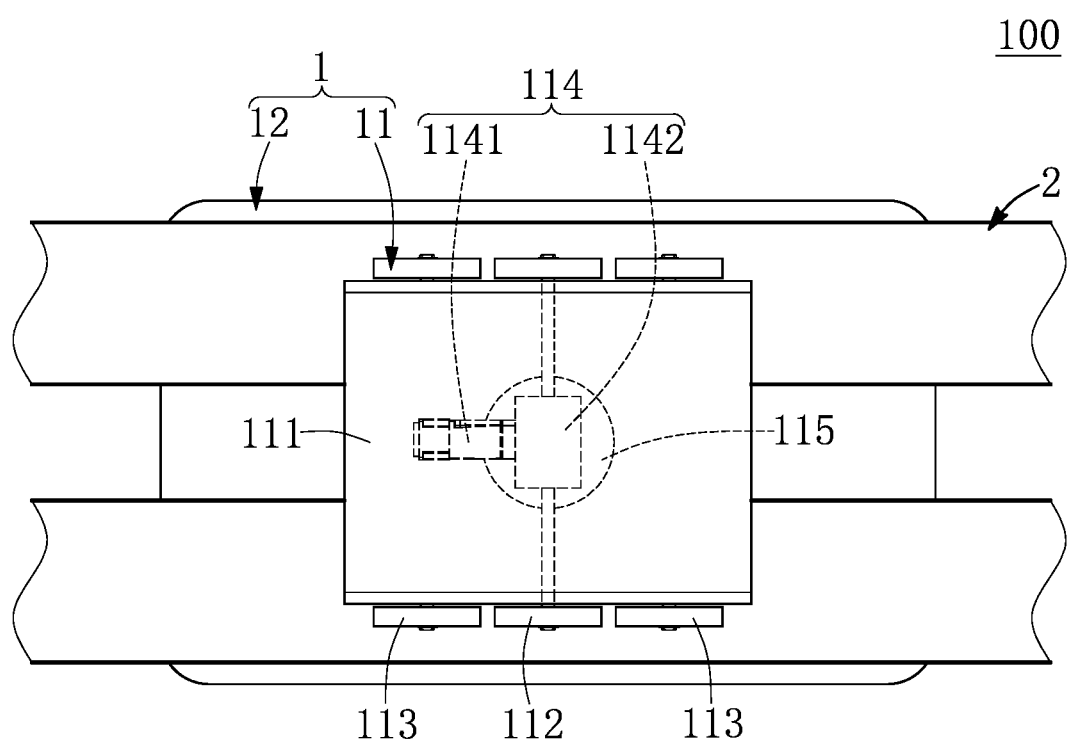
FIG. 4 is an enlarged view showing a differential overhead trolley in another configuration according to the first embodiment of the present disclosure.

It should be noted that the driving unit 114 in the present embodiment includes two different configurations. As shown in FIG. 1 to FIG. 3, the driving unit 114 includes two driving motors 1141 configured to respectively and independently drive the two differential wheels 112, and the two driving motors 1141 are capable of respectively driving the two differential wheels 112 to forwardly roll on the rail module 2 by different rolling velocities. Or, as shown in FIG. 4, the driving unit 114 includes a differential 1142 connected to the two differential wheels 112 and a driving motor 1141 that is connected to the differential 1142, and the driving motor 1141 is configured to drive the two differential wheels 112 through the differential 1142 so as to be capable of forwardly rolling the two differential wheels 112 on the rail module 2 by different rolling velocities.

Figure 5:
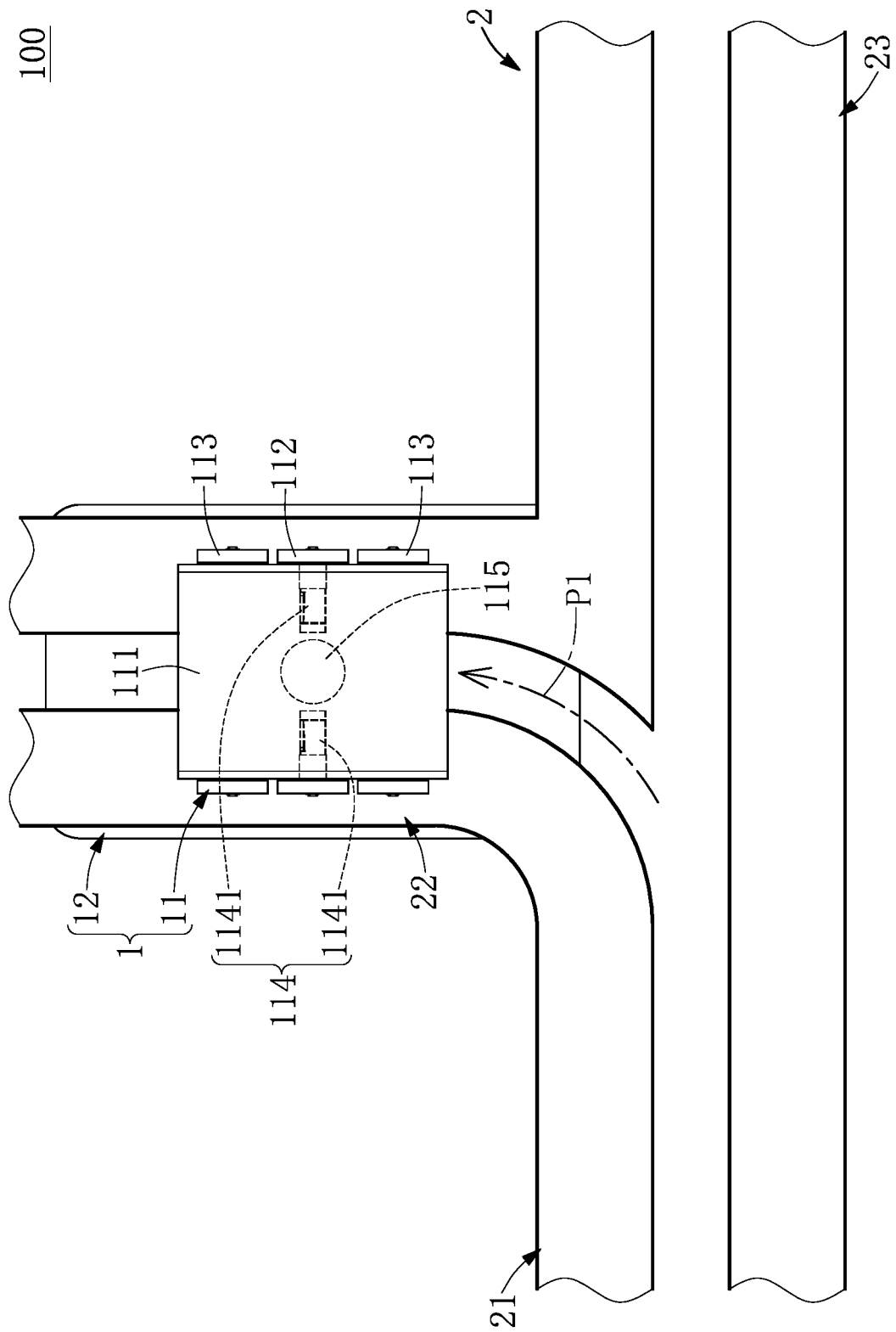
FIG. 5 is a top view showing the differential overhead trolley of FIG. 1 traveling along a turning path.
Figure 6:
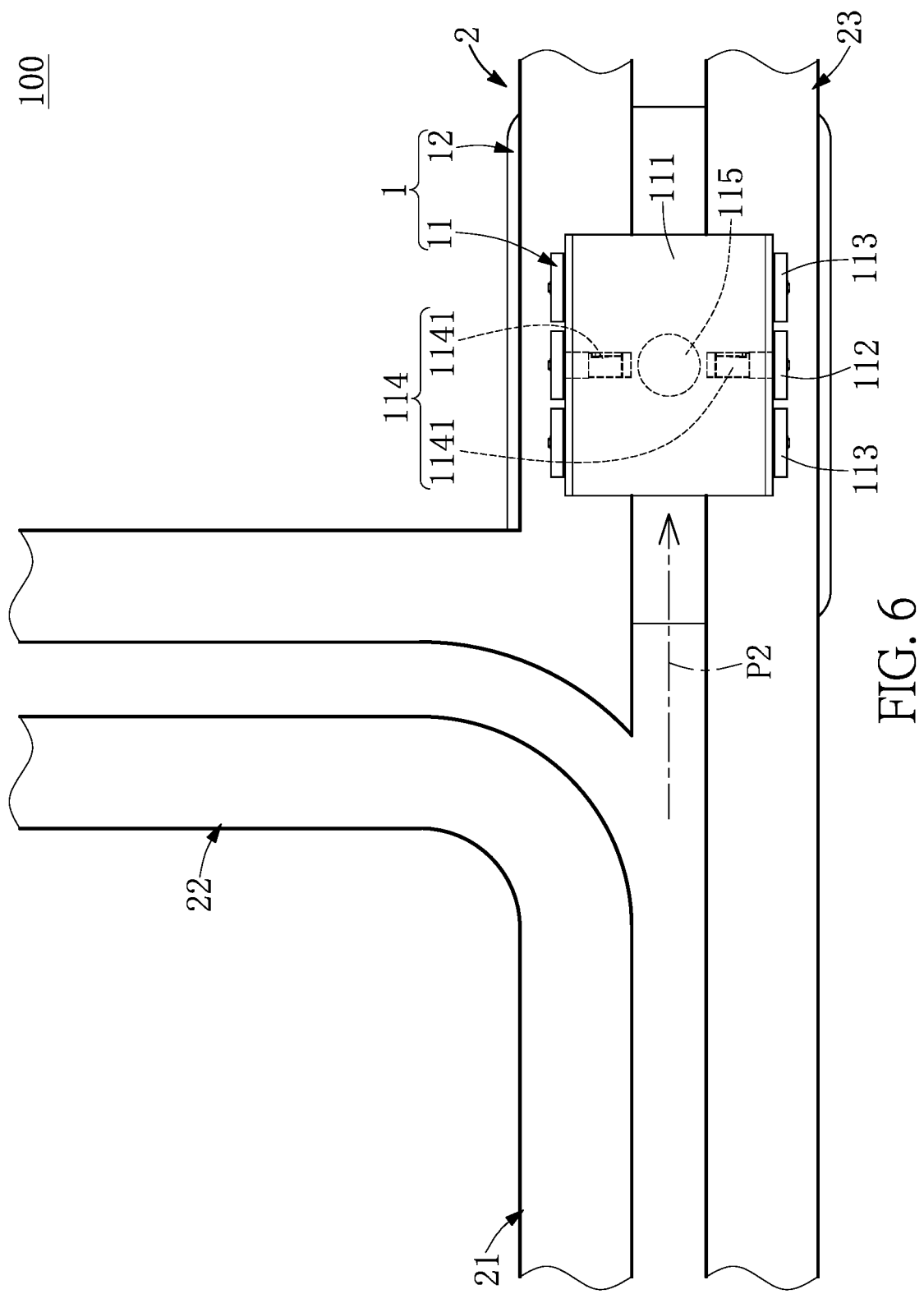
FIG. 6 is a top view showing the differential overhead trolley of FIG. 1 traveling along a straight path.

As shown in FIG. 1, FIG. 5, and FIG. 6, the rail module 2 includes a main rail 21, a first rail 22, and a second rail 23. The rail module 2 defines a turning path P1 and a straight path P2. The turning path P1 extends from the main rail 21 to the first rail 22, and the straight path P2 extends from the main rail 21 to the second rail 23. The turning path P1 and the straight path P2 in the present embodiment are defined by regions through which the differential overhead trolley 1 can travel, but the present disclosure is not limited thereto.

Moreover, the main rail 21, the first rail 22, and the second rail 23 in the present embodiment are connected to substantially form a T-shaped structure, but the present disclosure is not limited thereto. For example, in other embodiments of the present disclosure, the main rail 21, the first rail 22, and the second rail 23 can be connected to substantially form a Y-shaped structure; or, the second rail 23 can be omitted, and the main rail 21 is only connected to the first rail 22 (i.e., the rail module 2 only has the turning path P1); or, the main rail 21 can be further connected to a third rail.

Accordingly, when the differential overhead trolley 1 is moved from the main rail 21 to the first rail 22 along the turning path P1, the driving unit 114 drives the two differential wheels 112 to forwardly roll on the first rail 22 by different rolling velocities. In addition, when the differential overhead trolley 1 is moved from the main rail 21 to the second rail 23 along the straight path P2, the driving unit 114 drives the two differential wheels 112 to forwardly roll on the second rail 23 by the same rolling velocity.

Specifically, the two differential wheels 112 would be respectively driven by the two driving motors 1141 shown in FIG. 1 or by the driving motor 1141 through the differential 1142 shown in FIG. 4, so that the two differential wheels 112 can be driven to roll by the same rolling velocity or different rolling velocities, but the present disclosure is not limited thereto. For example, in other embodiments of the present disclosure, the two differential wheels 112 can be driven by a driving unit other than the driving unit 114 shown in FIG. 1 or FIG. 4.

Accordingly, the OHT apparatus 100 of the present embodiment is provided by assembling the two differential wheels 112 and the driving unit 114 to the differential overhead trolley 1, so that when the differential overhead trolley 1 travels in a turning area, the driving unit 114 can drive the two differential wheels 112 to run at different rolling velocities, thereby facilitating the differential overhead trolley 1 to forwardly move on different turning rails.

Second Embodiment

Referring to FIG. 7 to FIG. 11, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

Figure 7:
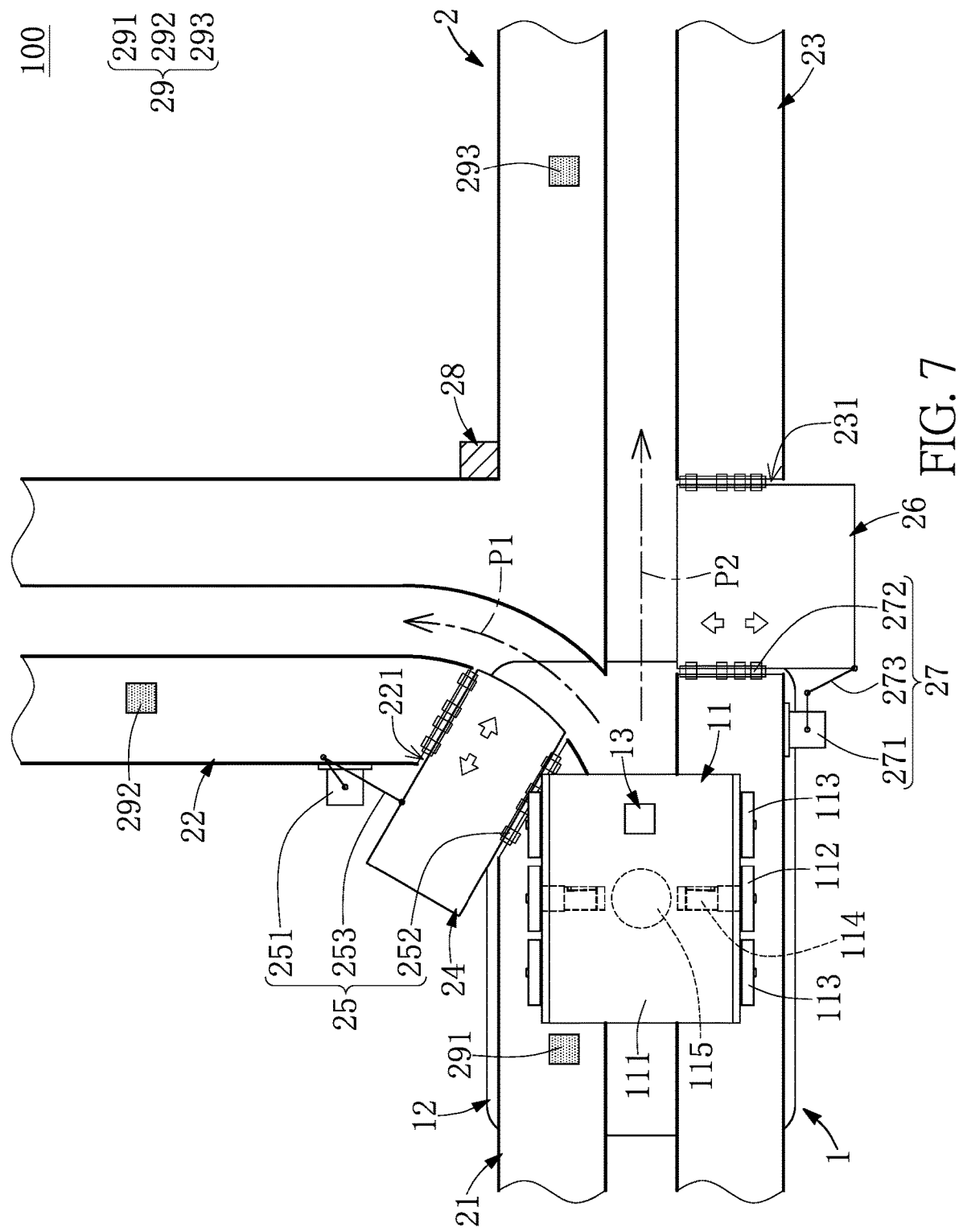
FIG. 7 is a top view of an OHT apparatus according to a second embodiment of the present disclosure.
Figure 8:
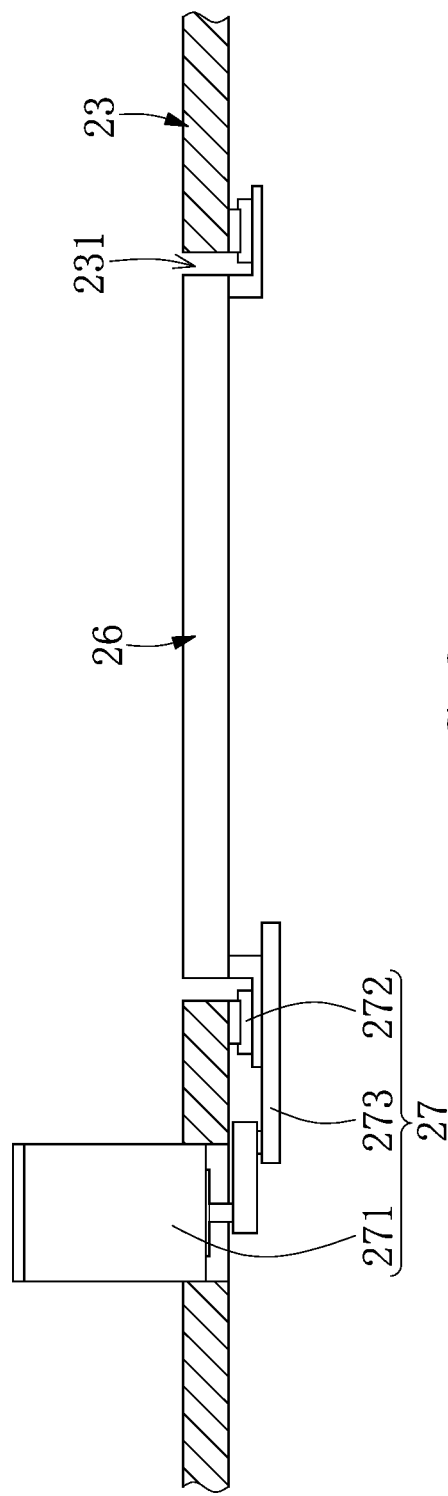
FIG. 8 is a lateral side view of a portion of FIG. 7.
Figure 9:
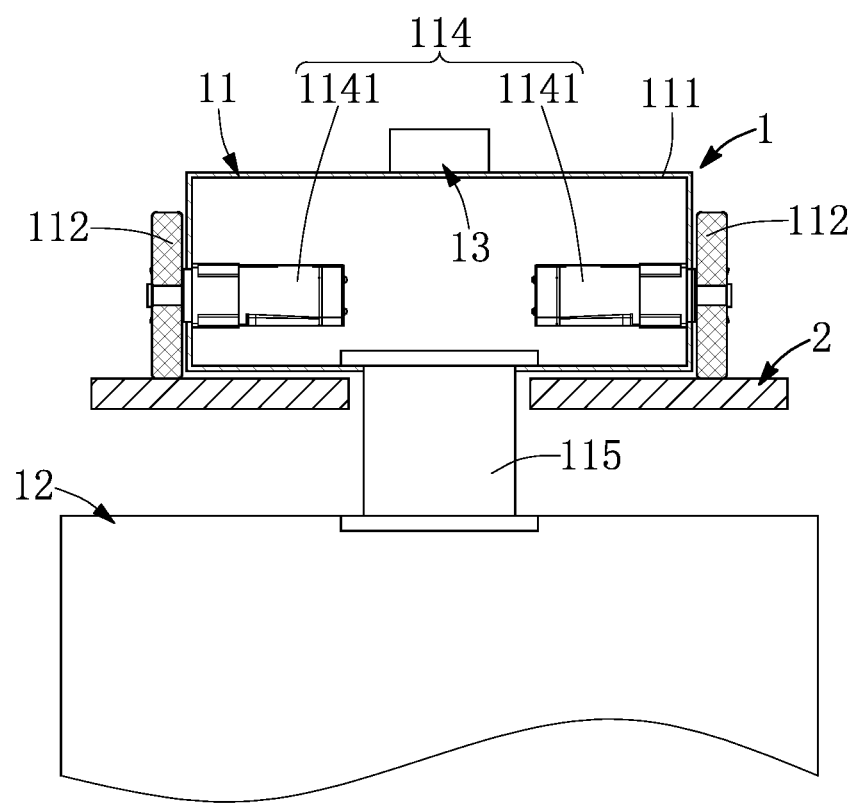
FIG. 9 is a cross-sectional view showing a portion of FIG. 7.

In the present embodiment, as shown in FIG. 7 to FIG. 9, the rail module 2 further includes a first supplementary rail 24 assembled to the first rail 22, a first switching mechanism 25 connected to the first supplementary rail 24, a second supplementary rail 26 assembled to the second rail 23, and a second switching mechanism 27 that is connected to the second supplementary rail 26, but the present disclosure is not limited thereto. For example, in other embodiments of the present disclosure, the rail module 2 can be provided without the second supplementary rail 26 and the second switching mechanism 27.

Figure 11:
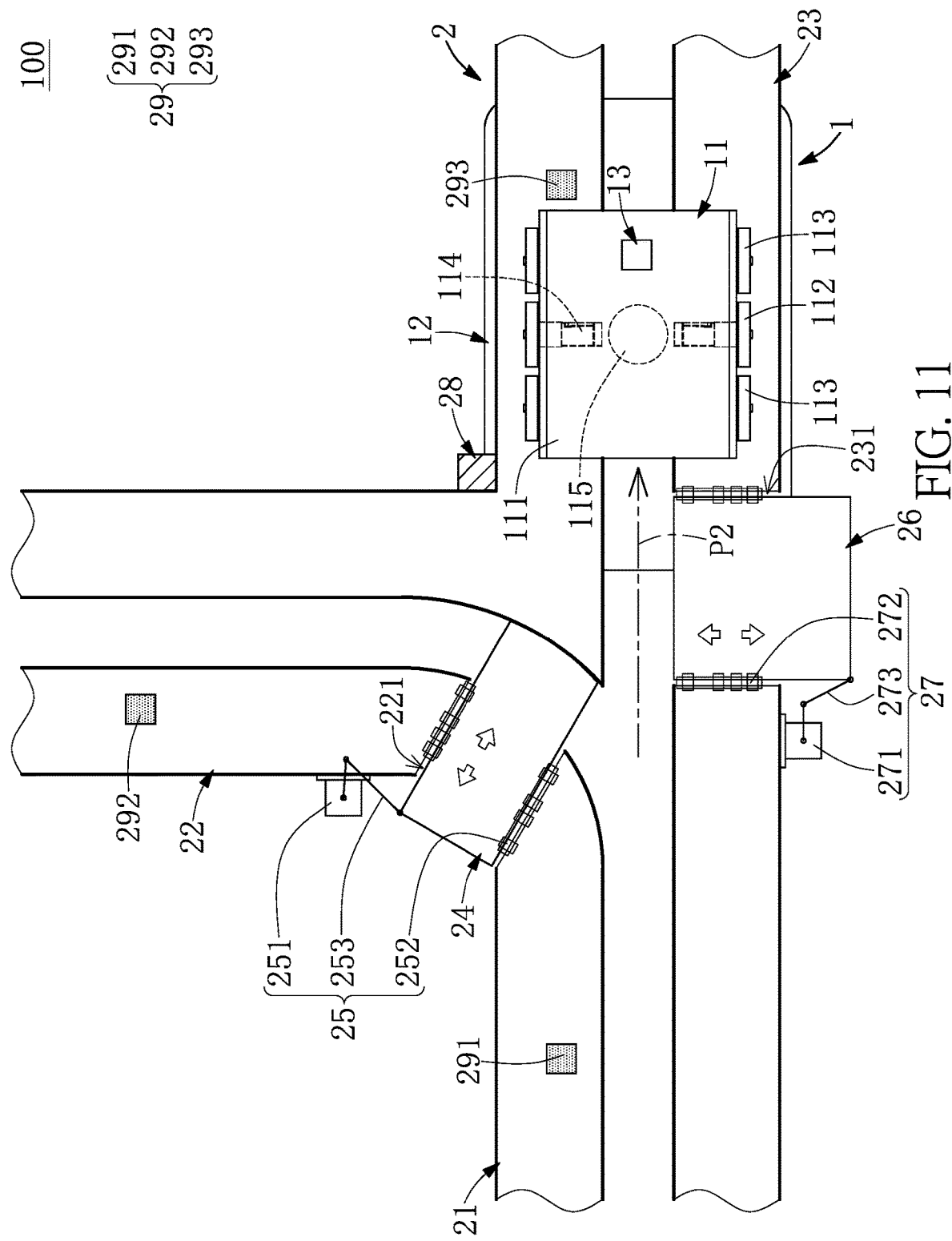
FIG. 11 is a top view showing the differential overhead trolley of FIG. 7 traveling along a straight path.

The first switching mechanism 25 is configured to drive the first supplementary rail 24 to move between a first initial position (as shown in FIG. 7) and a straight position (as shown in FIG. 11). In the present embodiment, the first switching mechanism 25 includes a first servomotor 251 assembled to the first rail 22, a first linear guideway assembly 252 connecting the first supplementary rail 24 and the first rail 22, and a first linkage member 253 (e.g., a connection rod) that connects the first servomotor 251 and the first linear guideway assembly 252.

Accordingly, the first servomotor 251 is configured to drive the first supplementary rail 24 through the first linkage member 253 so as to move the first supplementary rail 24 along the first linear guideway assembly 252 between the first initial position and the straight position, but the present disclosure is not limited thereto. For example, in other embodiments of the present disclosure, the first switching mechanism 25 can be provided by other configurations.

Specifically, when the first supplementary rail 24 is at the first initial position (as shown in FIG. 7), the first supplementary rail 24 corresponds in position to the first rail 22. Moreover, when the first supplementary rail 24 is at the straight position (as shown in FIG. 11), a portion of the first supplementary rail 24 is arranged at the straight path P2 and is located between the main rail 21 and the second rail 23.

It should be noted that the first supplementary rail 24 is preferably arranged adjacent to the main rail 21, and the position relationship between the first supplementary rail 24 and the first rail 22 in the present embodiment is substantially described as follows. The first rail 22 has a first separation slot 221 arranged at the turning path P1, and when the first supplementary rail 24 is at the first initial position, the first supplementary rail 24 is disposed in the first separation slot 221 to define a portion of the turning path P1.

However, the position relationship between the first supplementary rail 24 and the first rail 22 is not limited to the above description. For example, in other embodiments of the present disclosure, the first rail 22 can be provided without the first separation slot 221, and when the first supplementary rail 24 is at the first initial position, the first supplementary rail 24 is located under the first rail 22.

Figure 10:
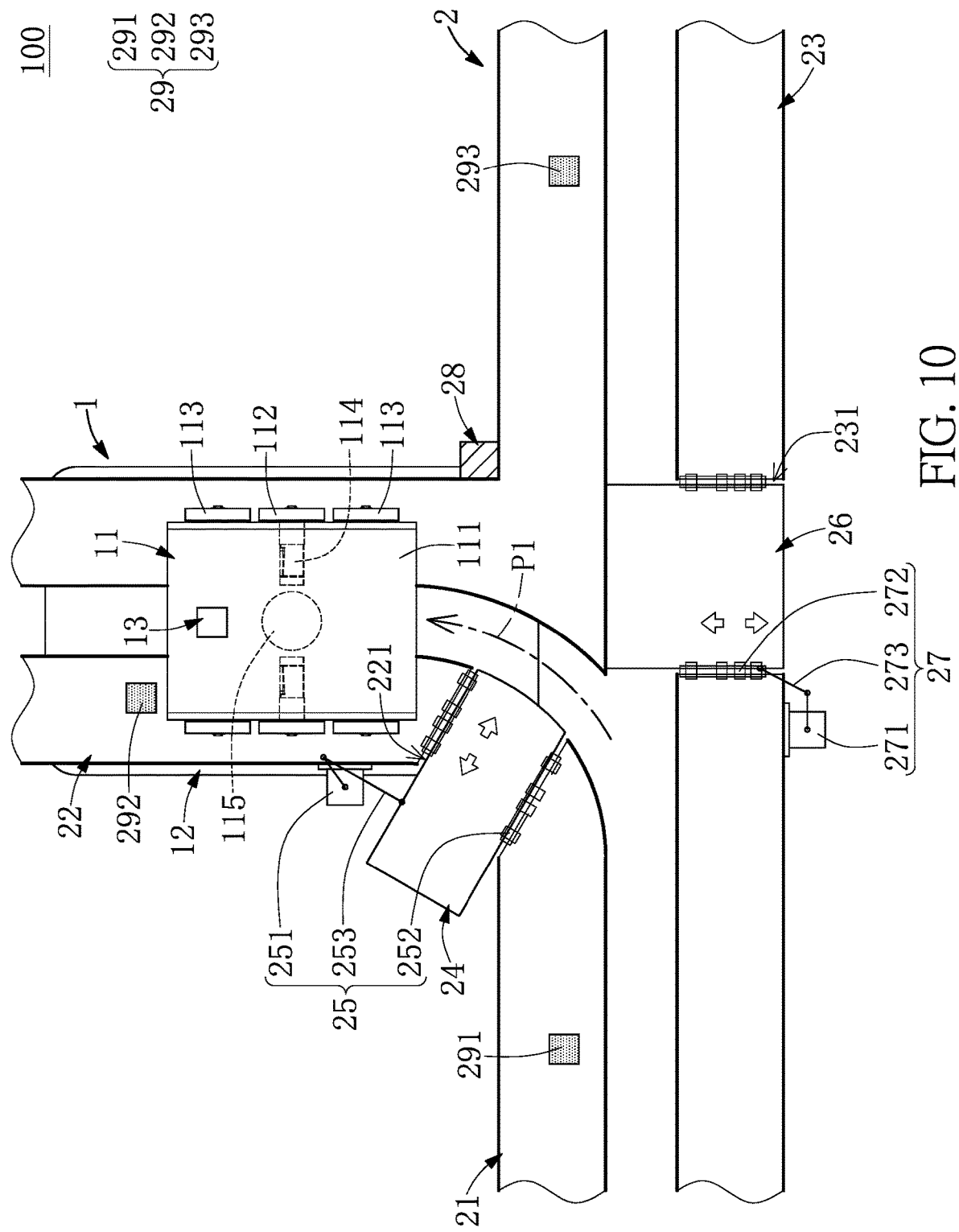
FIG. 10 is a top view showing a differential overhead trolley of FIG. 7 traveling along a turning path.

The second switching mechanism 27 is configured to drive the second supplementary rail 26 to move between a second initial position (as shown in FIG. 7) and a turn position (as shown in FIG. 10). In the present embodiment, the second switching mechanism 27 includes a second servomotor 271 assembled to the second rail 23, a second linear guideway assembly 272 connecting the second supplementary rail 26 and the second rail 23, and a second linkage member 273 (e.g., a connection rod) that connects the second servomotor 271 and the second linear guideway assembly 272.

Accordingly, the second servomotor 271 is configured to drive the second supplementary rail 26 through the second linkage member 273 so as to move the second supplementary rail 26 along the second linear guideway assembly 272 between the second initial position and the turn position, but the present disclosure is not limited thereto. For example, in other embodiments of the present disclosure, the second switching mechanism 27 can be provided by other configurations.

Specifically, when the second supplementary rail 26 is at the second initial position (as shown in FIG. 7), the second supplementary rail 26 corresponds in position to the second rail 23. Moreover, when the second supplementary rail 26 is at the turn position (as shown in FIG. 10), a portion of the second supplementary rail 26 is arranged at the turning path P1 and is located between the main rail 21 and the first rail 22.

It should be noted that the second supplementary rail 26 is preferably arranged adjacent to the main rail 21, and the position relationship between the second supplementary rail 26 and the second rail 23 in the present embodiment is substantially described as follows. The second rail 23 has a second separation slot 231 arranged at the straight path P2, and when the second supplementary rail 26 is at the second initial position, the second supplementary rail 26 is disposed in the second separation slot 231 to define a portion of the straight path P2.

However, the position relationship between the second supplementary rail 26 and the second rail 23 is not limited to the above description. For example, in other embodiments of the present disclosure, the second rail 23 can be provided without the second separation slot 231, and when the second supplementary rail 26 is at the second initial position, the second supplementary rail 26 is located under the second rail 23.

In summary, as shown in FIG. 7 and FIG. 10, when the differential overhead trolley 1 is moved from the main rail 21 to the first rail 22 along the turning path P1, the first supplementary rail 24 is at the first initial position, and the second supplementary rail 26 is at the turn position to be partially arranged in the turning path P1, so that a distance defined by the differential overhead trolley 1 in a suspension state traveling along the turning path P1 can be reduced. Moreover, as shown in FIG. 7 and FIG. 11, when the differential overhead trolley 1 is moved from the main rail 21 to the second rail 23 along the straight path P2, the second supplementary rail 26 is at the second initial position, and the first supplementary rail 24 is at the straight position to be partially arranged in the straight path P2, so that a distance defined by the differential overhead trolley 1 in a suspension state traveling along the straight path P2 can be reduced. In other words, in the present embodiment, the first supplementary rail 24 is at the first initial position, or the second supplementary rail 26 is at the second initial position.

Furthermore, the rail module 2 includes a receiver 28 electrically coupled to the first switching mechanism 25 and the second switching mechanism 27, and the differential overhead trolley 1 includes an emitter 13 configured to wirelessly transmit a signal to the receiver 28. The emitter 13 is configured to transmit a switching signal to the receiver 28, so that the first switching mechanism 25 is allowed to move the first supplementary rail 24 toward the straight position, or the second switching mechanism 27 is allowed to move the second supplementary rail 26 toward the turn position. In addition, the emitter 13 can transmit a switching signal to the receiver 28, so that the first switching mechanism 25 is allowed to move the first supplementary rail 24 toward the first initial position, or the second switching mechanism 27 is allowed to move the second supplementary rail 26 toward the second initial position.

As shown in FIG. 7 to FIG. 9, in order to accurately operate and drive the first switching mechanism 25 and the second switching mechanism 27, the rail module 2 includes a plurality of marks 29 disposed on the main rail 21, the first rail 22, and the second rail 23. The marks 29 in the present embodiment include a bifurcation mark 291, a turn mark 292, and a straight mark 293.

The bifurcation mark 291 is disposed on the main rail 21 and is arranged adjacent to the first rail 22. In other words, one of the marks 29 on the main rail 21 adjacent to the first rail 22 (and the second rail 23) is defined as the bifurcation mark 291; or, the last one of the marks 29 on the main rail 21 is defined as the bifurcation mark 291.

Moreover, the turn mark 292 is disposed on the first rail 22, and the turn mark 292 corresponds in position to a portion of the first rail 22 that carries the walking mechanism 11 (just) crossing the first supplementary rail 24. The straight mark 293 is disposed on the second rail 23, and the straight mark 293 corresponds in position to a portion of the second rail 23 that carries the walking mechanism 11 (just) crossing the second supplementary rail 26.

Specifically, after the differential overhead trolley 1 detects the bifurcation mark 291 (e.g., the bifurcation mark 291 can be detected by the differential overhead trolley 1 after the differential overhead trolley 1 crosses a penultimate one of the marks 29 on the main rail 21; in other words, the bifurcation mark 291 can be detected by the differential overhead trolley 1 before the differential overhead trolley 1 crosses the bifurcation mark 291), the emitter 13 is configured to emit the switching signal to the receiver 28, thereby moving the first supplementary rail 24 by the first switching mechanism 25 or moving the second supplementary rail 26 by the second switching mechanism 27. Moreover, the differential overhead trolley 1 is configured to confirm whether the switching signal is correctly executed by detecting the turn mark 292 or the straight mark 293.

Accordingly, the first switching mechanism 25 and the second switching mechanism 27 in the present embodiment are driven by the emitter 13 of the differential overhead trolley 1, thereby increasing the operation performance of the OHT apparatus 100, but the present disclosure is not limited thereto. For example, in other embodiments of the present disclosure, the first switching mechanism 25 and the second switching mechanism 27 can be driven by a mechanism (e.g., a control center) other than the differential overhead trolley 1.

In conclusion, the OHT apparatus of the present disclosure is provided by assembling the two differential wheels and the driving unit to the differential overhead trolley, so that when the differential overhead trolley travels in a turning area, the driving unit can drive the two differential wheels to run by different rolling velocities, thereby facilitating the differential overhead trolley to forwardly move on different turning rails.

Moreover, in the OHT apparatus of the present disclosure, the operation of the first supplementary rail and the operation of the second supplementary rail can be provided to effectively reduce a distance defined by the differential overhead trolley in a suspension state traveling along the turning path or the straight path, thereby increasing the stability of the differential overhead trolley.

Furthermore, in the OHT apparatus of the present disclosure, the first switching mechanism and the second switching mechanism are driven by using the emitter of the differential overhead trolley, thereby increasing the operation performance of the OHT apparatus.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An overhead hoist transfer (OHT) apparatus, comprising:
   a rail module including a main rail and a first rail, wherein the rail module defines a turning path that extends from the main rail to the first rail; and
   a differential overhead trolley being movably disposed on the rail module and including:
      a walking mechanism including two differential wheels arranged on two opposite sides thereof and a driving unit that is connected to the two differential wheels, wherein, when the differential overhead trolley is moved from the main rail to the first rail along the turning path, the driving unit drives the two differential wheels to forwardly roll on the first rail at different rolling velocities; and
      a carrying body connected to the walking mechanism and hung on the rail module;
   wherein the rail module includes a second rail and defines a straight path that extends from the main rail to the second rail, and wherein, when the differential overhead trolley is moved from the main rail to the second rail along the straight path, the driving unit drives the two differential wheels to forwardly roll on the second rail by the same rolling velocity;
   wherein the rail module includes:
   a first supplementary rail assembled to the first rail; and
   a first switching mechanism connected to the first supplementary rail, wherein the first switching mechanism is configured to drive the first supplementary rail to move between a first initial position and a straight position;
   wherein, when the first supplementary rail is at the first initial position, the first supplementary rail corresponds in position to the first rail, and wherein, when the first supplementary rail is at the straight position, a portion of the first supplementary rail is arranged at the straight path and is located between the main rail and the second rail;

wherein the first rail has a first separation slot arranged at the turning path, and wherein, when the first supplementary rail is at the first initial position, the first supplementary rail is disposed in the first separation slot to define a portion of the turning path.

2. The OHT apparatus according to claim 1, wherein the driving unit includes two driving motors configured to respectively and independently drive the two differential wheels, and wherein, when the differential overhead trolley is moved from the main rail to the first rail along the turning path, the two driving motors respectively drive the two differential wheels to forwardly roll on the first rail by the different rolling velocities.

3. The OHT apparatus according to claim 1, wherein the driving unit includes:
a differential connected to the two differential wheels; and
a driving motor connected to the differential;
wherein, when the differential overhead trolley is moved from the main rail to the first rail along the turning path, the driving motor drives the two differential wheels through the differential so as to forwardly roll the two differential wheels on the first rail by the different rolling velocities.

4. The OHT apparatus according to claim 1, wherein the walking mechanism includes a plurality of driven wheels unconnected to the driving unit, and the driven wheels are rollably disposed on the rail module.

5. The OHT apparatus according to claim 4, wherein the walking mechanism includes:
a main body receiving the driving unit therein, wherein the two differential wheels are respectively assembled to two opposite sides of the main body, the driven wheels are respectively assembled to the two opposite sides of the main body, and any one of the two differential wheels is located between two of the driven wheels adjacent to each other; and
a connecting member, wherein one end of the connecting member is connected to the main body, and another end of the connecting member passes through the rail module to connect to the carrying body.

6. The OHT apparatus according to claim 1, wherein the first switching mechanism includes:
a first servomotor assembled to the first rail;
a first linear guideway assembly connecting the first supplementary rail and the first rail; and
a first linkage member connecting the first servomotor and the first linear guideway assembly, wherein the first servomotor is configured to drive the first supplementary rail through the first linkage member so as to move the first supplementary rail along the first linear guideway assembly between the first initial position and the straight position.

7. The OHT apparatus according to claim 1, wherein the rail module includes:
a second supplementary rail assembled to the second rail; and
a second switching mechanism connected to the second supplementary rail, wherein the second switching mechanism is configured to drive the second supplementary rail to move between a second initial position and a turning position;
wherein, when the second supplementary rail is at the second initial position, the second supplementary rail corresponds in position to the second rail, and wherein, when the second supplementary rail is at the turn position, a portion of the second supplementary rail is arranged at the turning path and is located between the main rail and the first rail.

8. The OHT apparatus according to claim 7, wherein the second rail has a second separation slot arranged at the straight path, and wherein, when the second supplementary rail is at the second initial position, the second supplementary rail is disposed in the second separation slot to define a portion of the straight path.

9. The OHT apparatus according to claim 7, wherein the second switching mechanism includes:
a second servomotor assembled to the second rail;
a second linear guideway assembly connecting the second supplementary rail and the second rail; and
a second linkage member connecting the second servomotor and the second linear guideway assembly, wherein the second servomotor is configured to drive the second supplementary rail through the second linkage member so as to move the second supplementary rail along the second linear guideway assembly between the second initial position and the turn position.

10. The OHT apparatus according to claim 7, wherein the rail module includes a receiver electrically coupled to the first switching mechanism and the second switching mechanism, and the differential overhead trolley includes an emitter configured to wirelessly transmit a signal to the receiver, and wherein the emitter is configured to transmit a switching signal to the receiver, so that the first switching mechanism is allowed to move the first supplementary rail toward the straight position, or the second switching mechanism is allowed to move the second supplementary rail toward the turn position.

11. The OHT apparatus according to claim 10, wherein the rail module includes:
a bifurcation mark disposed on the main rail and arranged adjacent to the first rail;
a turn mark disposed on the first rail, wherein the turn mark corresponds in position to a portion of the first rail that carries the walking mechanism crossing the first supplementary rail; and
a straight mark disposed on the second rail, wherein the straight mark corresponds in position to a portion of the second rail that carries the walking mechanism crossing the second supplementary rail;
wherein, after the differential overhead trolley detects the bifurcation mark, the emitter is configured to emit the switching signal to the receiver, and the differential overhead trolley is configured to confirm whether the switching signal is correctly executed by detecting the turn mark or the straight mark.

12. The OHT apparatus according to claim 7, wherein the first supplementary rail is at the first initial position or the second supplementary rail is at the second initial position.

13. An overhead hoist transfer (OHT) apparatus, comprising:
a rail module including a main rail and a first rail, wherein the rail module defines a turning path that extends from the main rail to the first rail; and
a differential overhead trolley being movably disposed on the rail module and including:
a walking mechanism including two differential wheels arranged on two opposite sides thereof and a driving unit that is connected to the two differential wheels, wherein, when the differential overhead trolley is moved from the main rail to the first rail along the turning path, the driving unit drives the two differential wheels to forwardly roll on the first rail at different rolling velocities; and a carrying body connected to the walking mechanism and hung on the rail module;

wherein the rail module includes a second rail and defines a straight path that extends from the main rail to the second rail, and wherein, when the differential overhead trolley is moved from the main rail to the second rail along the straight path, the driving unit drives the two differential wheels to forwardly roll on the second rail by the same rolling velocity;

wherein the rail module includes:

a first supplementary rail assembled to the first rail; and a first switching mechanism connected to the first supplementary rail, wherein the first switching mechanism is configured to drive the first supplementary rail to move between a first initial position and a straight position;

wherein, when the first supplementary rail is at the first initial position, the first supplementary rail corresponds in position to the first rail, and wherein, when the first supplementary rail is at the straight position, a portion of the first supplementary rail is arranged at the straight path and is located between the main rail and the second rail;

wherein the first switching mechanism includes:

a first servomotor assembled to the first rail;

a first linear guideway assembly connecting the first supplementary rail and the first rail; and a first linkage member connecting the first servomotor and the first linear guideway assembly, wherein the first servomotor is configured to drive the first supplementary rail through the first linkage member so as to move the first supplementary rail along the first linear guideway assembly between the first initial position and the straight position.

14. An overhead hoist transfer (OHT) apparatus, comprising:

a rail module including a main rail and a first rail, wherein the rail module defines a turning path that extends from the main rail to the first rail; and a differential overhead trolley being movably disposed on the rail module and including:

a walking mechanism including two differential wheels arranged on two opposite sides thereof and a driving unit that is connected to the two differential wheels, wherein, when the differential overhead trolley is moved from the main rail to the first rail along the turning path, the driving unit drives the two differential wheels to forwardly roll on the first rail at different rolling velocities; and a carrying body connected to the walking mechanism and hung on the rail module;

wherein the rail module includes a second rail and defines a straight path that extends from the main rail to the second rail, and wherein, when the differential overhead trolley is moved from the main rail to the second rail along the straight path, the driving unit drives the two differential wheels to forwardly roll on the second rail by the same rolling velocity;

wherein the rail module includes:

a first supplementary rail assembled to the first rail; and a first switching mechanism connected to the first supplementary rail, wherein the first switching mechanism is configured to drive the first supplementary rail to move between a first initial position and a straight position;

wherein, when the first supplementary rail is at the first initial position, the first supplementary rail corresponds in position to the first rail, and wherein, when the first supplementary rail is at the straight position, a portion of the first supplementary rail is arranged at the straight path and is located between the main rail and the second rail;

wherein the rail module includes:

a second supplementary rail assembled to the second rail; and a second switching mechanism connected to the second supplementary rail, wherein the second switching mechanism is configured to drive the second supplementary rail to move between a second initial position and a turning position;

wherein, when the second supplementary rail is at the second initial position, the second supplementary rail corresponds in position to the second rail, and wherein, when the second supplementary rail is at the turn position, a portion of the second supplementary rail is arranged at the turning path and is located between the main rail and the first rail.

* * * * *